(12) United States Patent
Shigeto et al.

(10) Patent No.: US 8,124,940 B2
(45) Date of Patent: Feb. 28, 2012

(54) CHARGED PARTICLE BEAM APPARATUS

(75) Inventors: Kunji Shigeto, Mito (JP); Takeshi Ogashiwa, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 271 days.

(21) Appl. No.: 12/351,523

(22) Filed: Jan. 9, 2009

(65) Prior Publication Data

US 2009/0184256 A1 Jul. 23, 2009

(30) Foreign Application Priority Data

Jan. 18, 2008 (JP) ................. 2008-008613

(51) Int. Cl.
*G21K 1/08* (2006.01)
*H01J 3/14* (2006.01)
*H01J 49/42* (2006.01)
*H01J 3/26* (2006.01)

(52) U.S. Cl. .................... 250/396 R; 250/310

(58) Field of Classification Search .......... 250/306–311, 250/396 R, 396 ML
See application file for complete search history.

(56) References Cited

U.S. PATENT DOCUMENTS

| | | | |
|---|---|---|---|
| 3,937,959 A * | 2/1976 | Namae ............................ | 250/310 |
| 5,089,699 A * | 2/1992 | Ose et al. ....................... | 250/310 |
| 5,939,026 A * | 8/1999 | Seki et al. ............... | 250/396 ML |
| 6,194,730 B1 * | 2/2001 | Chalupka et al. ......... | 250/396 R |
| 6,677,585 B2 | 1/2004 | Nomura | |
| 2003/0025085 A1 * | 2/2003 | Nakano ................... | 250/396 ML |
| 2004/0222376 A1 * | 11/2004 | Sasaki et al. ................... | 250/310 |
| 2005/0199827 A1 * | 9/2005 | Nagano ......................... | 250/311 |
| 2005/0253083 A1 | 11/2005 | Sato et al. | |
| 2005/0285036 A1 * | 12/2005 | Sato et al. ...................... | 250/310 |
| 2006/0043293 A1 * | 3/2006 | Doi et al. ....................... | 250/310 |
| 2006/0219908 A1 * | 10/2006 | Inada et al. .................... | 250/310 |
| 2007/0125956 A1 * | 6/2007 | Buschbeck et al. ........ | 250/396 R |

FOREIGN PATENT DOCUMENTS

| | | |
|---|---|---|
| JP | 63-166130 | 7/1988 |
| JP | 01-146238 | 6/1989 |
| JP | 2002-015691 | 1/2002 |
| JP | 2007-087971 | 4/2007 |

OTHER PUBLICATIONS

Japanese Office Action, w/ English translation thereof, issued in Japanese Patent Application No. JP 2008-008613 dated Nov. 22, 2011.

* cited by examiner

*Primary Examiner* — Robert Kim
*Assistant Examiner* — Brooke Purinton
(74) *Attorney, Agent, or Firm* — McDermott Will & Emery LLP

(57) ABSTRACT

Disclosed herein is a scanning electron microscope having a function for positioning an object point of an objective lens at a defined position even under an electronic optical condition in which it is difficult to accurately control the position of the object point of the objective lens. A deflector is provided to deflect an electron beam in order to detect the object point and located at a desired position of the object point of the objective lens. The deflector is not used to scan a sample with the electron beam. The scanning electron microscope has a function for automatically adjusting the position of the object point to ensure that the object point of the objective lens is located at the position of the object point detection deflector by using a characteristic in which a displacement of an image by the deflector is minimal when the object point is located at the position of the deflector.

5 Claims, 7 Drawing Sheets

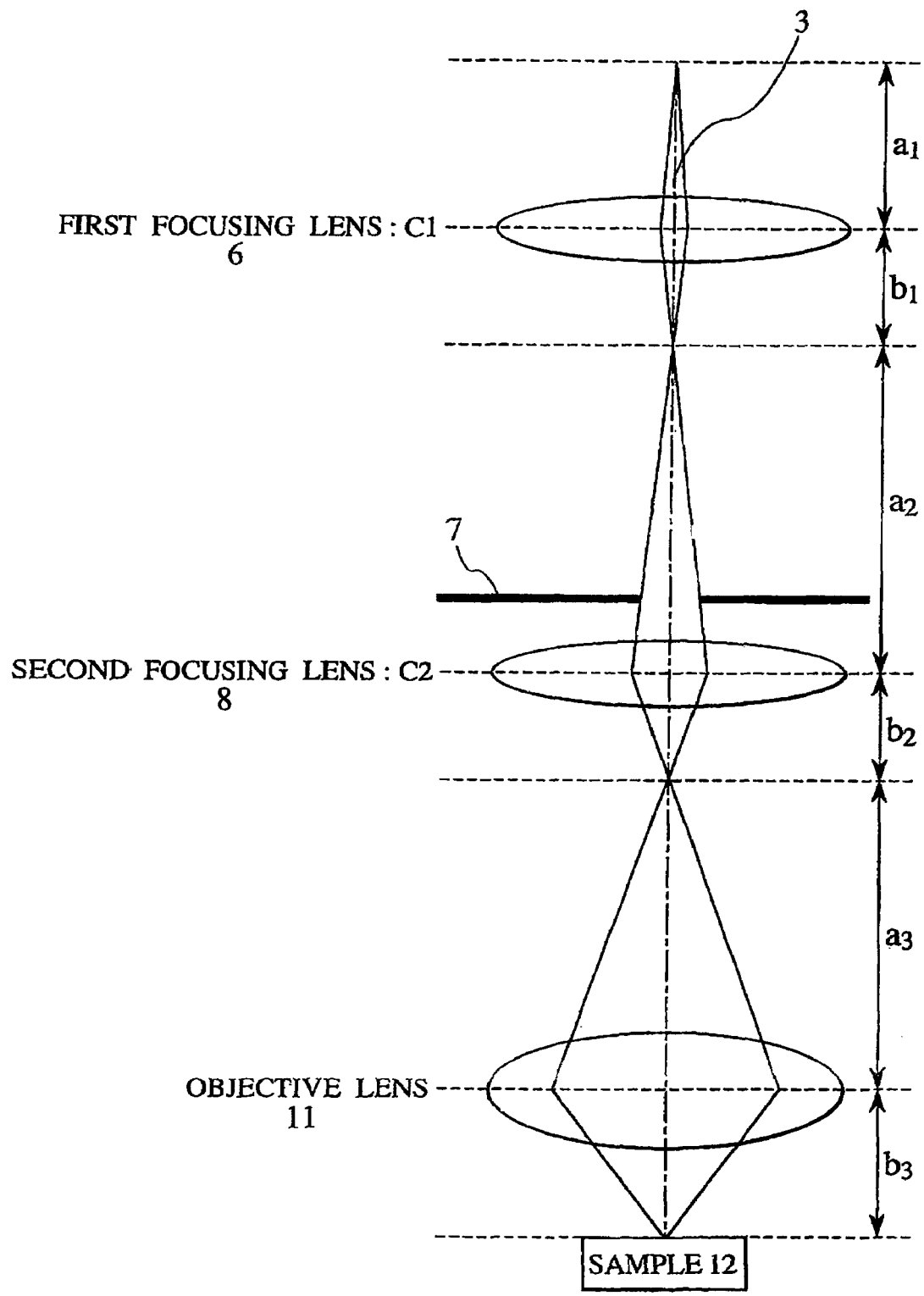

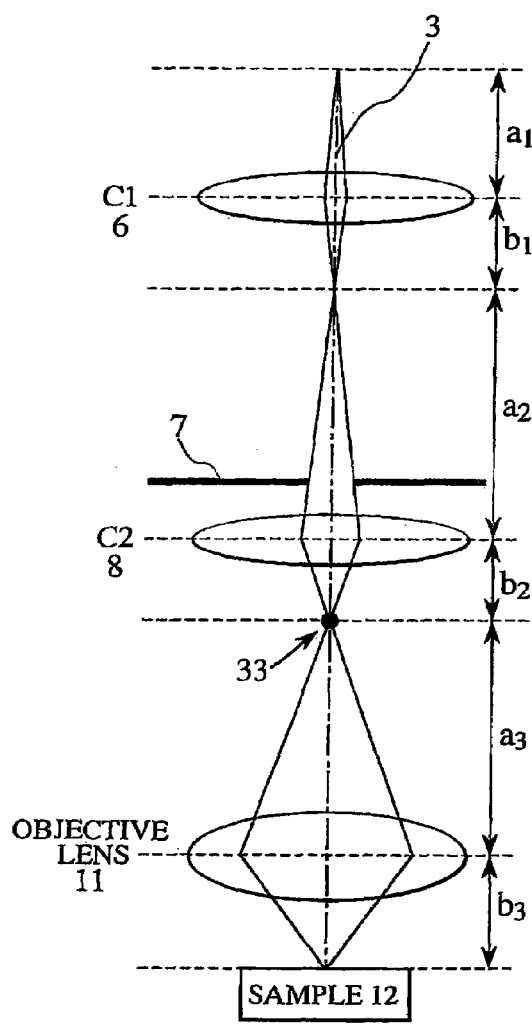
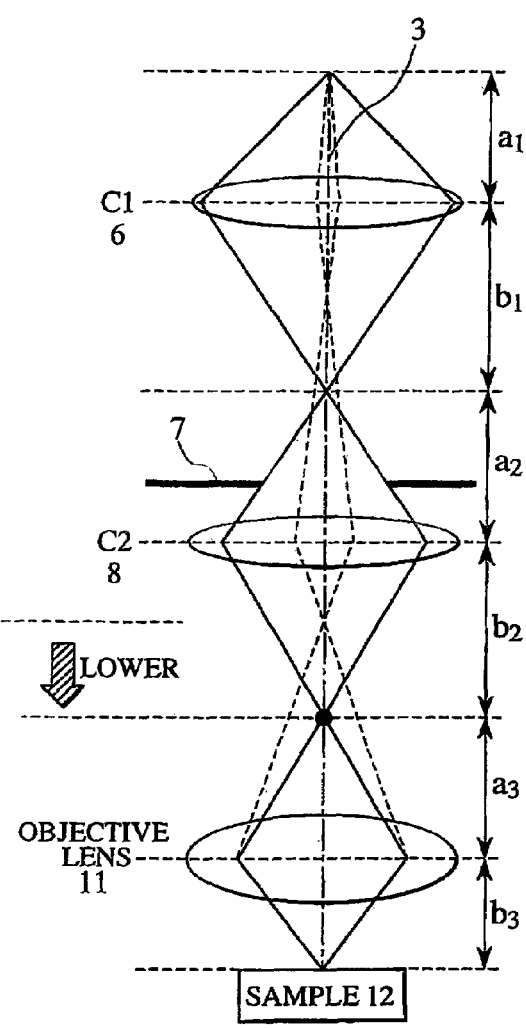
FIG. 2A — PROBE CURRENT: SMALL
FIG. 2B — PROBE CURRENT: LARGE

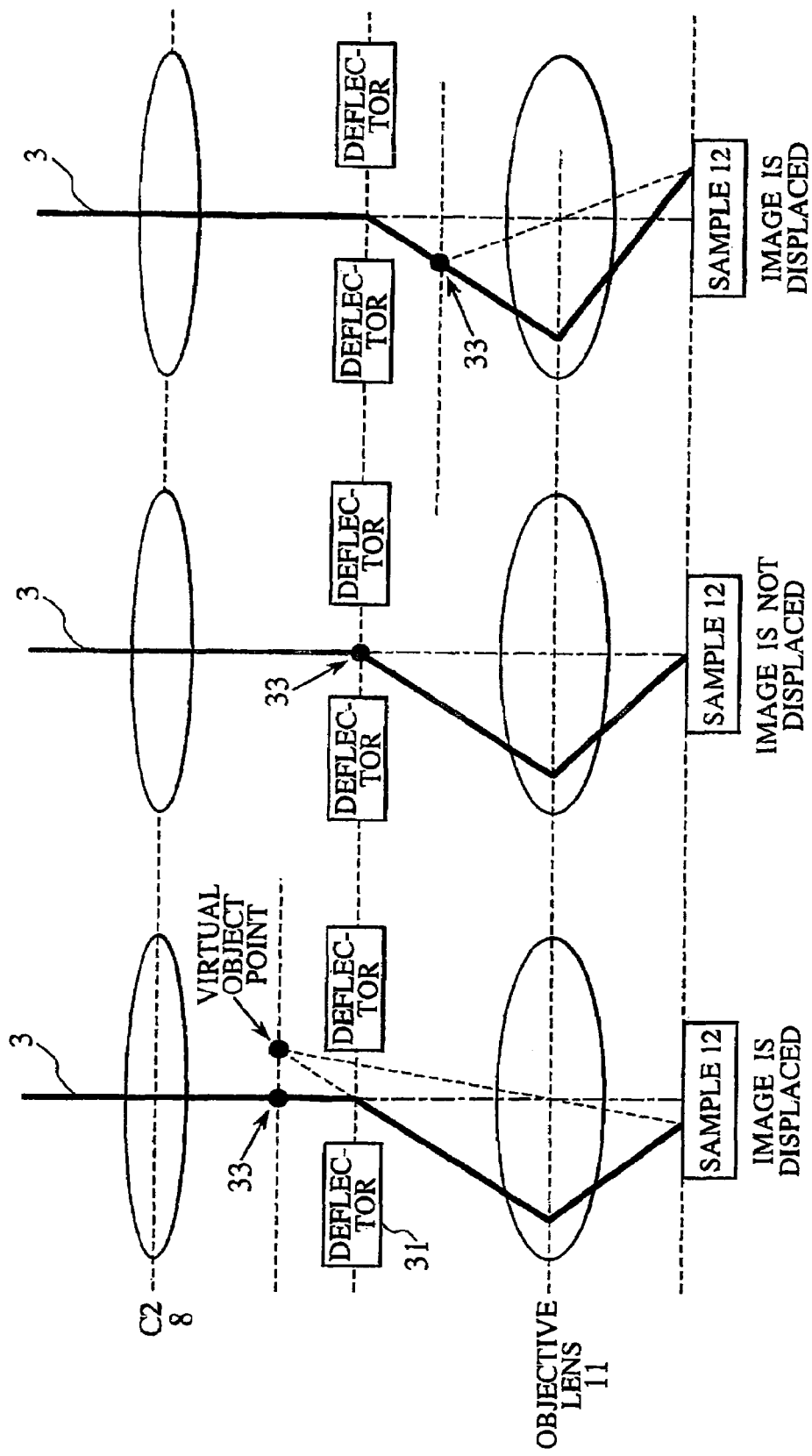

CHARGED PARTICLE BEAM APPARATUS

BACKGROUND OF THE INVENTION

1. Field of the Invention

The present invention relates to a charged particle beam apparatus, and more particularly to a charged particle beam apparatus capable of improving magnification accuracy.

2. Description of the Related Art

For a charged particle beam apparatus represented by a scanning electron microscope, high focusing accuracy and high magnification accuracy are required. For example, an electron beam needs to be accurately focused with a desired gap between the surface of a sample and a focal point at which the beam is focused. In addition, an enlarged image of the sample needs to be accurately displayed at a desired magnification. Therefore, it is necessary for a lens (provided in the charged particle beam apparatus) for focusing the electron beam to be controlled with high accuracy to ensure that the focal point of the electron beam is located at a desired position.

For example, the magnification of the scanning electron microscope is defined by the position of the sample, i.e., a working distance (WD). The magnification of the scanning electron microscope is represented as a ratio of an image displacement that is displayed by a CRT or on a picture and corresponds to a movement of a probe scanning the surface of the sample to the distance of the movement of the probe scanning the surface of the sample. In order to accurately display the magnification of the scanning electron microscope (SEM), it is necessary that the WD be set to a defined distance. The WD is determined based on the distance between an objective lens and the position of an object point of the objective lens and on an excitation current applied to the objective lens. It is therefore necessary to accurately control the position of the object point of the objective lens in order to set the WD to the defined distance.

The charged particle beam apparatus is used for a wide variety of purposes such as observation of a sample with high resolution, measurement of the size of the sample, inspection of appearance of the sample, and analysis of the sample. There is an optical system optimized for each of the purposes. Therefore, when the charged particle beam apparatus is used for the purposes, it is necessary that the focal point of the electron beam focused by the lens largely vary.

The lens for focusing the electron beam, which is provided in the charged particle beam apparatus, needs to be set under a wide variety of conditions with high accuracy.

With the increased needs for measurement using a large probe current, in many cases a sample is irradiated with a large current to measure the sample. With such a situation, it has been noticeable that a magnification displayed by a charged particle beam apparatus is disadvantageously different from the actual magnification.

In a conventional technique for correcting an error in the magnification, for instance, a displacement of a focal point and uncertainty in a setting value for each lens are accurately measured for each of setting conditions for purposes for use of the charged particle beam apparatus. The measured results are stored in the charged particle beam apparatus. One or more of the measured results suitable for a certain condition for use of the device are read out to correct the lens.

In a technique disclosed in JP-A-2002-15691, a certain magnification is specified, and a scanned image is displayed. In addition, an actual magnification is obtained by using a reference sample, and the displayed specified magnification is changed to the actual magnification.

SUMMARY OF THE INVENTION

In the conventional techniques, however, it is necessary beforehand to obtain measured data for each of many conditions for purposes for use of the charged particle beam apparatus. In addition, when part of hardware such as an electron beam source and a lens is replaced, or when a peripheral environment of the device such as an external magnetic field is changed, the position of the focal point at which the electron beam is focused may be affected by the replacement or the change. Therefore, it is disadvantageously necessary to again obtain data for correction of the position of the focal point.

In the technique disclosed in JP-A-2002-15691, the reference sample is required to correct the actual magnification. In addition, it is necessary to observe the reference sample when an optical condition is changed.

An object of the present invention is to improve accuracy of focusing of an objective lens, magnification accuracy (depending on the focusing accuracy) and measurement accuracy (depending on the focusing accuracy) through a simple method.

To accomplish the object, according to the present invention, a deflector, which is adapted to deflect an electron beam in order to detect an object point of an objective lens, is provided at a defined position of the object point of the objective lens. The deflector is not used in order to scan a sample with the electron beam. By using a characteristic in which a displacement of an image due to an operation of the deflector is minimal when the object point is located at the position of the deflector, the position of the object point of the objective lens is automatically adjusted to ensure that the object point is located at the position of the deflector.

According to the present invention, focusing accuracy of an objective lens and magnification accuracy are improved in a measurement using a large probe current.

BRIEF DESCRIPTION OF THE DRAWINGS

Other objects and advantages of the invention will become apparent from the following description of embodiments with reference to the accompanying drawings in which:

FIG. 1 is a schematic diagram showing the configuration of a lens of a typical scanning electron microscope;

FIGS. 2A and 2B are schematic diagrams showing optical systems configured based on probe currents different from each other;

FIGS. 3A to 3C are schematic diagrams showing three types of trajectories of the primary electron beams depending on the positions of object points of an objective lens;

DESCRIPTION OF THE PREFERRED EMBODIMENTS

A charged particle beam apparatus according to an embodiment of the present invention is described below.

Figure 5:
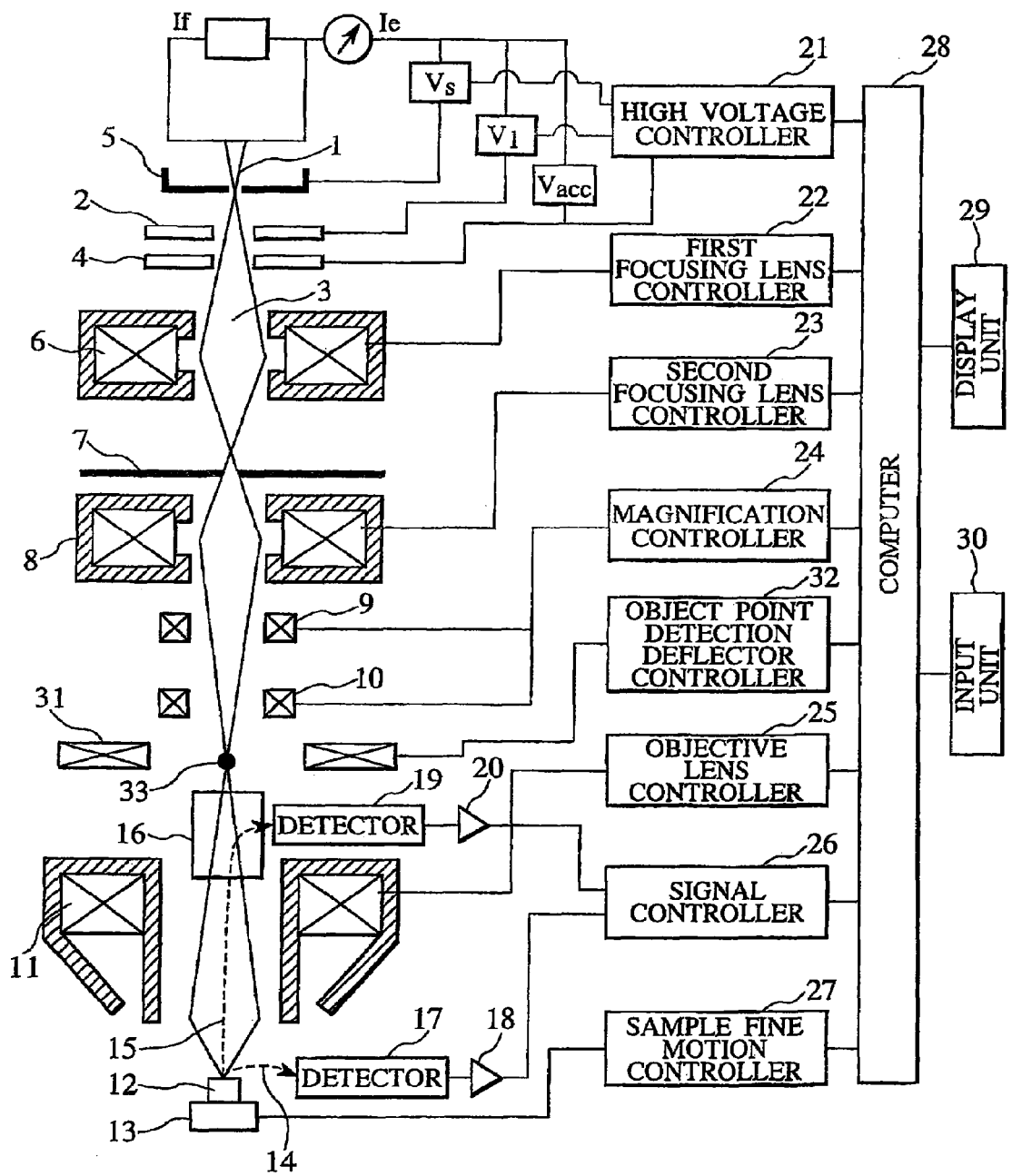
FIG. 5 is a schematic diagram of the configuration of a scanning electron microscope having an object point detection deflector provided at a single position.

FIG. 5 is a diagram showing an outline configuration of a scanning electron microscope (SEM) used in the embodiment of the present invention. The scanning electron microscope shown in FIG. 5 has a Schottky-type electron gun. However, an electron beam device, an electron gun or the like may be used. For example, the electron beam device may be a scanning transmission electron microscope (STEM).

The electron gun may be a field-emission electron gun (FEG), a thermal (thermally assisted) field-emission electron gun, a thermionic-emission electron gun or the like, in addition to the Schottky-type electron gun.

The electron gun emits a primary electron beam 3 by means of an extraction voltage $V_1$ applied between a cathode 1 and a first anode 2. The primary electron beam 3 is then accelerated by an acceleration voltage $V_{acc}$ applied to a second anode 4 and propagates to a downstream electromagnetic lens system. A suppressor electrode 5 is adapted to suppress an unnecessary thermal electron emitted by causing a heating current If to flow in a filament holding the cathode. A negative suppressor voltage Vs is applied to the suppressor electrode 5. A high voltage controller 21 has a function for generating the acceleration voltage $V_{acc}$, the extraction voltage $V_1$ and the suppressor voltage Vs. The high voltage controller 21 is controlled by a computer 28.

A first focusing lens 6 is controlled by a first focusing lens controller 22 to focus the primary electron beam 3. After the first focusing lens 6 focuses the primary electron beam 3, the primary electron beam 3 is diffused again. An objective diaphragm 7 is adapted to limit the angle of incidence of the primary electron beam 3 on the surface of a sample 12 with respect to a normal to the surface of the sample 12. A second focusing lens 8 is controlled by a second focusing lens controller 23 to focus the diffused primary electron beam 3 again. An objective lens 11 is controlled by an objective lens controller 25 to narrow the primary electron beam 3 and thereby form an electron probe. An upper deflection coil 9 and a lower deflection coil 10 constitute a two-stage deflection coil. The upper deflection coil 9 and the lower deflection coil 10 are controlled by a magnification controller 24 to deflect the electron probe and scan the sample 12.

The sample 12 is placed on sample fine motion equipment 13. The sample fine motion equipment 13 is controlled by a sample fine motion controller 27. Electron signals are generated from a point at which the primary electron beam 3 is incident on the sample 12. Of the electron signals, a signal that is reflected at a relatively small angle with respect to the normal to the surface of the sample 12 and has high energy is regarded as a backscattered electron signal 14. Of the electron signals, a signal having low energy is regarded as a secondary electron signal 15. The backscattered electron signal 14 is detected by a detector 17 and amplified by an amplifier 18. When the objective lens 11 is of semi-in-lens type, the secondary electron signal 15 is directed upward by a magnetic field of the objective lens 11, and then detected by a detector 19 and amplified by an amplifier 20 without displacement of the axis of the primary electron beam 3. In this case, an orthogonal electric and magnetic field (EXB) device 16 provided above the objective lens 11 prevents the displacement of the axis of the primary electron beam 3. It should be noted that the type of the objective lens 11 is not limited in the present invention.

The computer 28 controls the high voltage controller 21, the first focusing lens controller 22, the second focusing lens controller 23, the magnification controller 24, the objective lens controller 25, a signal controller 26, and the sample fine motion controller 27. The computer 28 processes the amplified secondary electron signal and the amplified backscattered electron signal to cause a display unit 29 to display an enlarged image of the sample on a screen of the display unit 29.

Data is input to the computer 28 through an input unit 30.

Next, a description will be made of a problem with a measurement using a large probe current, i.e., a problem in the case where the position of the focal point of the electron beam largely varies.

As a typical optical system of the scanning electron microscope, the lens configuration of a three-stage demagnification optical system (shown in FIG. 1) composed of two focusing lenses ($C_1$ and $C_2$) and a single objective lens is known.

A role of the focusing lenses is described below. As shown in FIG. 1, the objective diaphragm 7 is provided between a first condenser lens (hereinafter referred to as a $C_1$ lens) 6 and a second condenser lens (hereinafter referred to as a $C_2$ lens) 8.

The amount of the probe current increases as a focal point of the $C_1$ lens 6 approaches the objective diaphragm 7. The probe current can be controlled by controlling an excitation current flowing in the $C_1$ lens 6 and thereby moving the focal point of the $C_1$ lens 6 up and down. The probe current may be controlled by changing the diameter of an aperture of the objective diaphragm 7. In this case, the larger the diameter of the aperture of the objective diaphragm 7 is, the larger the probe current is.

The $C_2$ lens 8 is adapted to control a spreading angle (measured on an image plane of the objective lens 11 that includes the focal point of the objective lens 11 and is parallel to the normal to the surface of the sample 12) of the primary electron beam 3 to set the spreading angle to a predetermined angle (for example, an angle set to obtain an image having the highest resolution) by controlling an excitation current flowing in the $C_2$ lens 8 and thereby moving the focal point of the $C_2$ lens 8 up and down under any conditions (even under the condition that the focal point of the $C_1$ lens 6 or the diameter of the aperture of the objective diaphragm 7 is changed).

The distance between an object plane that includes the object point of the $C_1$ lens 6 and is parallel to the surface of the sample 12 and a main plane that includes the center of the $C_1$ lens 6 and is parallel to the surface of the sample 12 is defined as $a_1$. The distance between the main plane that includes the center of the $C_1$ lens 6 and is parallel to the surface of the sample 12 and an image plane that includes the focal point of the $C_1$ lens 6 and is parallel to the surface of the sample 12 is defined as $b_1$. The distance between an object plane that includes the object point of the $C_2$ lens 8 and is parallel to the surface of the sample 12 and a main plane that includes the center of the $C_2$ lens 8 and is parallel to the surface of the sample 12 is defined as $a_2$. The distance between the main plane that includes the center of the $C_2$ lens 8 and is parallel to the surface of the sample 12 and an image plane that includes the focal point of the $C_2$ lens 8 and is parallel to the surface of the sample 12 is defined as $b_2$. The distance between an object plane that includes the object point of the objective lens 11 and is parallel to the surface of the sample 12 and a main plane that includes the center of the objective lens 11 and is parallel to the surface of the sample 12 is defined as $a_3$. The distance between the main plane that includes the center of the objective lens 11 and is parallel to the surface of the sample 12 and the image plane that includes the focal point of the objective lens 11 and is parallel to the surface of the sample 12 is defined as $b_3$. When an uncertainty in the distance $a_1$ is $\Delta a_1$, $\Delta a_3 = \Delta a_1 \cdot (b_1/a_1)^2 \cdot (b_2/a_2)^2$, where $\Delta a_3$ is an uncertainty in the distance $a_3$. The uncertainty $\Delta a_1$ is transferred as represented in this expression. This relational expression is known as an effect caused by an axial magnification of the optical system. In addition, the uncertainty $\Delta a_3$ is transferred as represented by an expression of $\Delta b_3 = \Delta a_3 \cdot (b_3/a_3)^2$, where $\Delta b_3$ is an uncertainty in the distance $b_3$.

When the probe current is small, the following relationships are established: $b_1/a_1 < 1$, and $b_2/a_2 < 1$. Therefore, the uncertainty $\Delta a_1$ is transferred to ensure that the uncertainty $\Delta a_3$ is smaller than the uncertainty $\Delta a_1$.

In order to irradiate the surface of the sample 12 with a large probe current, the focal point of the $C_1$ lens 6 is set to be lower (the distance $b_1$ is increased), and the objective diaphragm 7 having an aperture with a large diameter is used.

FIGS. 2A and 2B are diagrams showing optical systems including the respective $C_1$ lenses 6 having focal points different from each other and the respective objective diaphragms 7 having aperture diameters different from each other. In the optical system shown in FIG. 2A, the distance $b_1$ is small, and the aperture diameter of the objective diaphragm 7 is small. In the optical system shown in FIG. 2B, the distance $b_1$ is large, and the aperture diameter of the objective diaphragm 7 is large. When the optical conditions of the optical system shown in FIG. 2A are changed to the optical conditions of the optical system shown in FIG. 2B, the focal point of the $C_2$ lens 8 (an object point 33 of the objective lens 11) is lowered and the distance $b_2$ is increased in order to maintain a range of angles of incidence of the primary electron beam 3 (output from the objective lens 11) on the surface of the sample 12 with respect to the normal to the surface of the sample 12. It is assumed that the optical system shown in FIG. 2A in which $a_1 = 50$, $b_1 = 50$, $a_2 = 150$ and $b_2 = 100$ is changed to the optical system shown in FIG. 2B in which $a_1 = 50$, $b_1 = 150$, $a_2 = 50$ and $b_2 = 150$ by changing the conditions of the $C_1$ and $C_2$ lenses. In the assumed case, the axial magnification $((b_1/a_1)^2 \cdot (b_2/a_2)^2)$ of the optical system shown in FIG. 2A is 0.44, and the axial magnification $((b_1/a_1)^2 \cdot (b_2/a_2)^2)$ of the optical system shown in FIG. 2B is 81. When the optical system shown in FIG. 2B is used and the uncertainty $\Delta a_1$ in the distance $a_1$ is 0.1 mm, the uncertainty $\Delta a_3$ in the distance $a_3$ is 8 mm. The uncertainty $\Delta a_3$ is an uncertainty in the position of the object point of the objective lens 11. That is, the uncertainty $\Delta a_3$ indicates an uncertainty in a defined position of the object point of the objective lens 11.

The amount of an excitation current to flow in the objective lens 11 is determined by determining (defining) the position of the object point and the position of an image point. When the object point 33 is shifted from the defined position of the object point, the amount of the excitation current (used to focus the primary electron beam 3 on the sample) supplied to the objective lens 11 is different from a defined amount of the excitation current. That is, the charged particle beam apparatus determines that the primary electron beam 3 is focused on a location different from the actual position of the sample. The difference is defined as focusing accuracy. In addition, since the device determines that the sample is positioned at the location different from the actual position of the sample and scans the location with the primary electron beam 3, a reduction in the focus accuracy directly leads to a reduction in magnification accuracy (i.e., length measurement accuracy). Furthermore, since it is expected that the uncertainty $\Delta a_1$ in the distance $a_1$ is more than 0.1 mm, the problem is more serious.

In order to solve the problem, an object point detection deflector 31 is provided at a defined position of the object point 33 of the objective lens 11. The object point detection deflector 31 is used to detect the object point 33 of the objective lens 11 and not used to scan the sample with the electron beam. The present invention uses a characteristic in which displacement of an image due to an operation of the deflector 31 is minimal when the object point of the objective lens 11 is positioned at the position of the deflector 31. According to the present invention, the object point 33 of the objective lens 11 is automatically positioned at the position of the object point detection deflector 31.

The type of the deflector 31 used to detect the position of the object point 33 of the objective lens 11 is not limited. The deflector 31 may be an electromagnetic deflector or an electrostatic deflector.

The contents of the present invention are described below in more detail.

An image of the sample, which can be used to evaluate a displacement of the image, is displayed by the display unit 29. When the input unit 30 instructs detection of the position of the object point 33 of the objective lens 11, the computer 28 determines a range of the amount of the excitation current to be supplied to the second focusing lens 8 and causes the excitation current with an amount within the determined range to flow in the second focusing lens 8 by means of the second focusing lens controller 23. The computer 28 controls the objective lens 11 by means of the objective lens controller 25 to automatically adjust the focus of the objective lens 11 and stores an image. The computer 28 operates the object point detection deflector 31 by means of an object point detection deflection circuit 32 to deflect the primary electron beam 3 at a certain angle. After that, the computer 28 stores an image again and performs image processing to compare the stored image with the image stored under the condition that the object point detection deflector 31 does not operate. The computer 28 measures the displacement of the image due to the operation of the object point detection deflector 31 and stores the measured displacement therein. The series of operations are performed under the condition that the amount of the excitation current flowing in the second focusing lens 8 is in the first determined range. The amount of the excitation current to flow in the second focusing lens 8 is determined to ensure that the displacement of the image due to the operation of the object point detection deflector 31 is minimal. The excitation current with the determined amount flows in the second focusing lens 8. The abovementioned process makes it possible to locate the object point 33 of the objective lens 11 at the position of the object point detection deflector 31.

Figure 4:
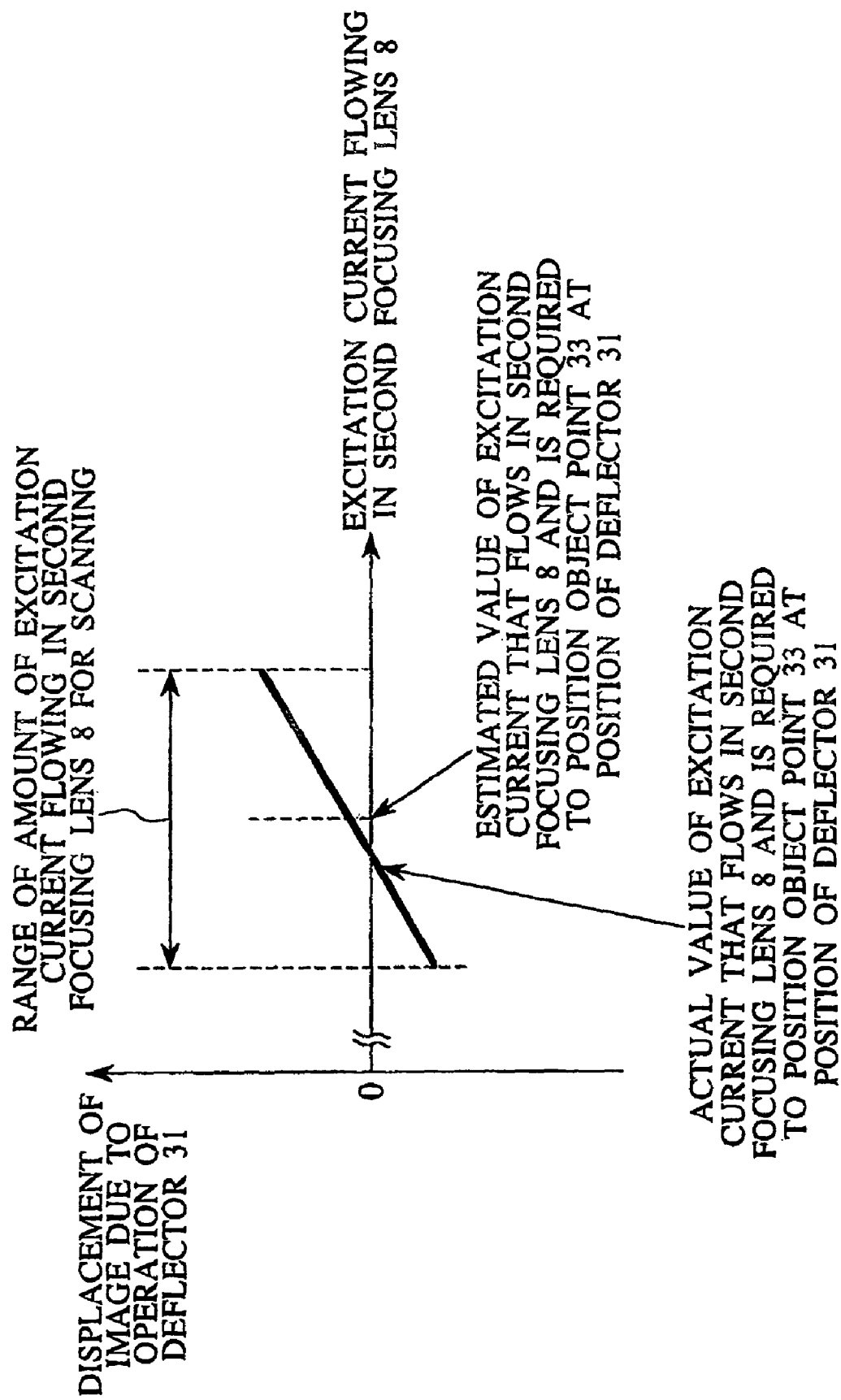
FIG. 4 is a graph showing the relationship between displacement of an image due to an operation of a deflector 31 and an excitation current flowing in a second focusing lens 8.

FIG. 4 is a graph showing the relationship between the displacement of the image due to the operation of the object point detection deflector 31 and the excitation current flowing in the second focusing lens 8. First, the amount (required to locate the object point 33 at an ideal position) of the excitation current to be supplied to the second focusing lens 8 is estimated. The amount of the excitation current is changed at any interval within a range close to the estimated amount. After an excitation current with a certain amount flows in the second focusing lens 8, an excitation current flowing in the objective lens 11 is adjusted to control the focus of an image. An image is obtained under the condition that the object point detection deflector 31 does not operate, and another image is obtained under the condition that the object point detection deflector 31 operates. By comparing the two obtained images with each other, the displacement of the image due to the operation of the deflector 31 is measured. The amount of the excitation current to be supplied to the condenser lens (second focusing lens 8) under the condition that the displacement of the image due to the operation of the deflector 31 is minimal is obtained through the series of measurement operations and stored. When the excitation current with the obtained amount flows in the second focusing lens 8 again, the object point 33 can be located at the position of the object point detection deflector 31. All the abovementioned operations are automatically performed.

The object point detection deflector 31 may defect the electron beam at two different angles to ensure that a displacement of one of the images from the position of the other image is measured.

In order to understand that the displacement of the image by the deflector 31 is minimal when the object point 33 is present at the position of the deflector 31, only the trajectory of a beam spot at the center of the scanning electron microscope image is considered. At the moment when the beam spot is located at the center of the image, the upper and lower deflection coils 9 and 10 do not operate. Thus, it is not necessary to take the upper and lower deflection coils 9 and 10 into consideration. FIGS. 3A to 3C are schematic diagrams showing three types of trajectories of the primary electron beams 3 in the case where the positions of the object points 33 of the objective lens 11 are different from each other. Each of FIGS. 3A to 3C shows only the trajectory of the central axis of the primary electron beam 3. The deflector 31 shown in each of FIGS. 3A to 3C is used to detect the position of the object point 33. The primary electron beam 3 is deflected at the same angle at the position of the deflector 31 in each of FIGS. 3A to 3C. A black point shown in each of FIGS. 3A to 3C indicates the position of the object point 33 of the objective lens 11. In FIG. 3A, the black point is located above the deflector 31. In FIG. 3B, the black point is located at the position of the deflector 31. In FIG. 3C, the black point is located under the deflector 31. The image plane that includes the focal point of the objective lens 11 shown in each of FIGS. 3A to 3C is located on the sample 12. Since the primary electron beam 3 reaches a point intersecting the image plane (that includes the focal point of the objective lens 11) with a line connecting the object point 33 and the center of the objective lens 11, the position of a region (on the sample 12) which the primary electron beam 3 reaches can be estimated. As apparent from FIGS. 3A to 3C, the primary electron beam 3 reaches the same location as that in the case where the deflector 31 does not operate, only when the object point 33 is located at the position of the deflector 31. That is, it is apparent that only when the object point 33 is located at the position of the deflector 31, the image is not displaced.

Figure 6:
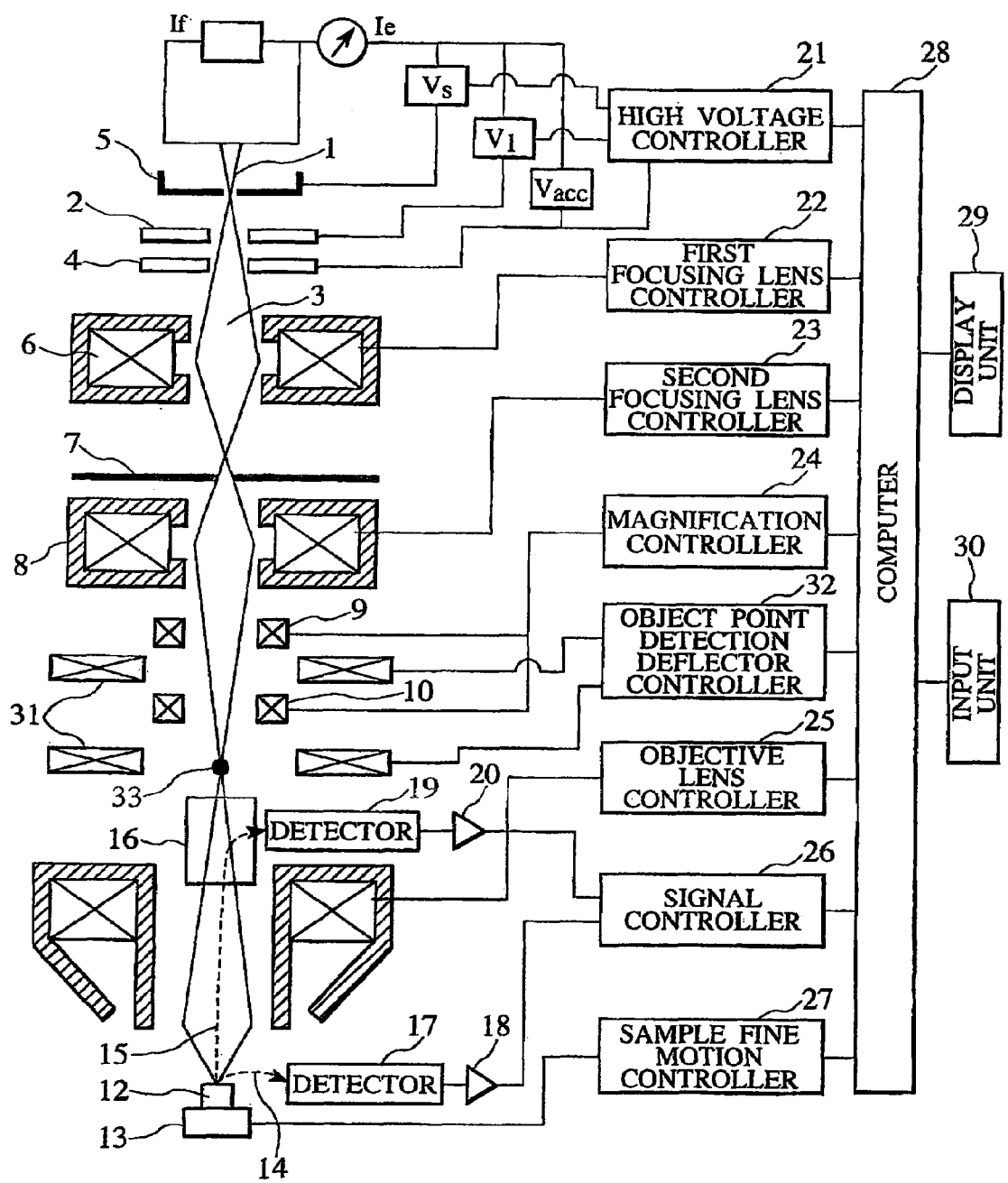
FIG. 6 is a schematic diagram of the configuration of a scanning electron microscope having object point detection deflectors provided at two positions.

FIG. 6 is a diagram schematically showing a scanning electron microscope (SEM) having two deflectors 31 that are used to detect the object point of the objective lens. One of the deflectors 31, which is used to detect the object point 33 located at a desired position, is selected by the computer 28. The desired position of the object point 33 largely depends on the diameter of the aperture of the objective diaphragm 7. When two different diameters of apertures of the objective diaphragm 7 can be selected, the two object point detection deflectors 31 are installed to support the two diameters of the apertures of the objective diaphragm 7. In order to detect object points 33 at more locations, it is necessary that the number of the object point detection deflectors 31 increase based on the number of the locations at which the object points 33 are detected. Alternatively, the deflector 31 may have a mechanism capable of moving up and down (in a vertical direction) to allow the deflector 31 to operate under various optical conditions such as the spreading angle of the primary electron beam.

Figure 7:
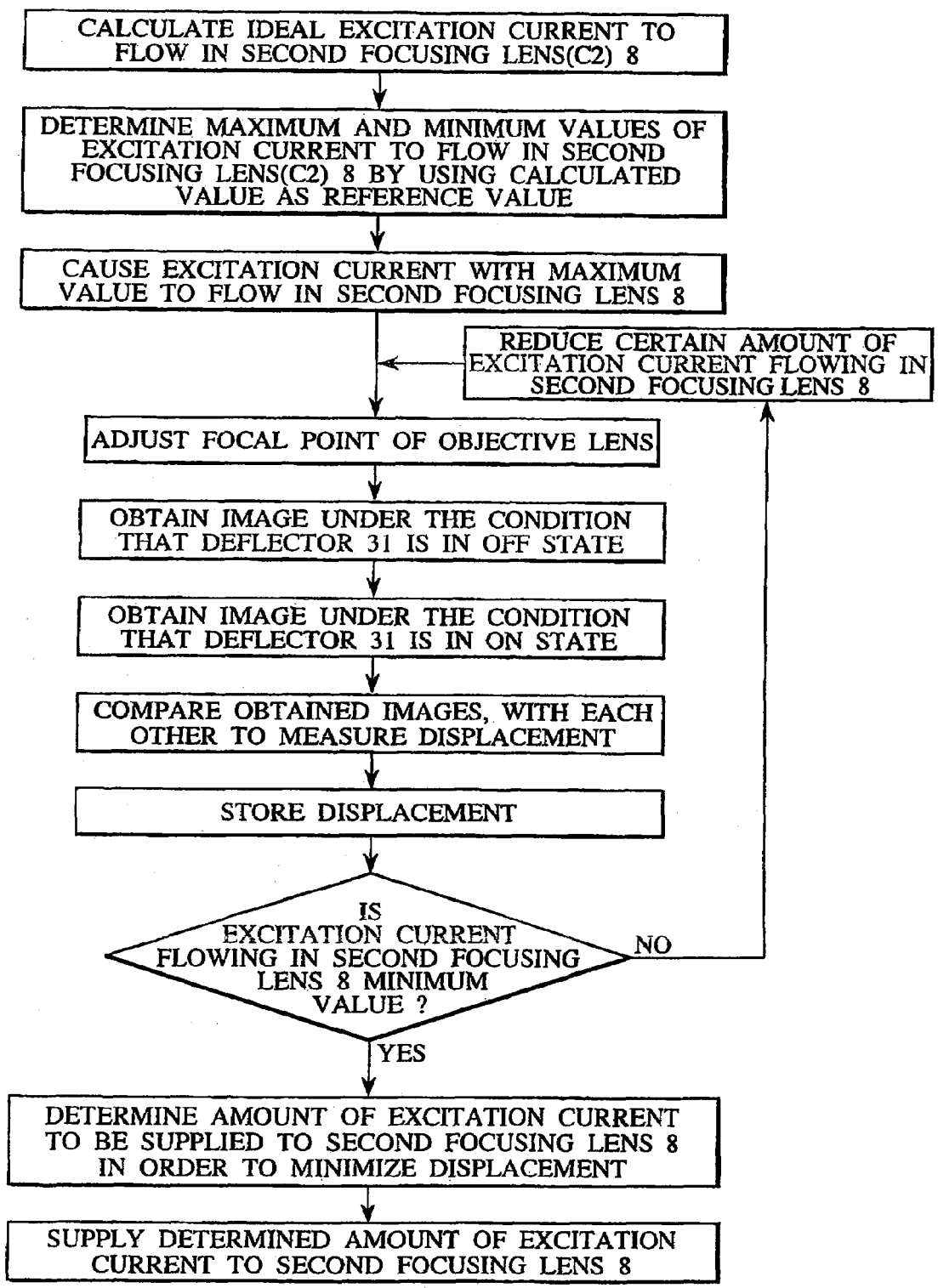
FIG. 7 is a flowchart showing a process for automatically correcting the position of an object point by means of the object point detection deflector.

FIG. 7 is a flowchart showing an example of automatic detection of the object point 33 by the object point detection deflector 31. In this example, a range (maximum value and minimum value) of the amount of the excitation current flowing in the second focusing lens 8 for the scanning is determined using an ideal calculated value as a reference value. In addition, in this example, the scanning of the sample is performed under the condition that the amount of the excitation current flowing in the second focusing lens 8 is changed from the maximum value to the minimum value.

In another embodiment of the present invention, once data on the graph (as shown in FIG. 4) showing the relationship between displacement of the image due to the operation of the deflector 31 and the excitation current flowing in the second focusing lens 8 is obtained, the displacement of the image has only to be measured for a single object point based on the obtained graph. The image displacement at the single object point and the graph can be used to obtain the position of an object point ensuring that there is no image displacement.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A charged particle beam apparatus comprising:
   a charged particle source for emitting a charged particle beam;
   a condenser lens for focusing the charged particle beam emitted by the charged particle source;
   an objective lens for focusing the charged particle beam on a sample;
   a scanning deflector for scanning the sample with the charged particle beam;
   a detector for detecting an electron generated by irradiation of the charged particle beam on the sample; and
   a deflector for deflecting the charged particle beam, wherein
   the deflector has a mechanism capable of moving up and down,
   the deflector deflects the charged particle beams by two different deflection amounts at a plurality of positions to ensure that two sample images are obtained, and a displacement of one of the sample images from the position of the other image is measured, and
   the condenser lens adjusts the position of a focal point of the charged particle beam based on the displacement of the one of the sample images from the position of the other image to ensure that the focal point of the charged particle beam is located at a predetermined position.

2. The charged particle beam apparatus according to claim 1, wherein
   the displacement of the one of the sample images from the position of the other image, which is based on the deflection amounts by which the deflector deflects the charged particle beam, is measured under the condition that the focal point of the charged particle beam varies, and
   the condenser lens adjusts the position of the focal point of the charged particle beam based on the displacement of the one of the sample images from the position of the other image to ensure that the focal point of the charged particle beam is located at a predetermined position.

3. The charged particle beam apparatus according to claim 1, wherein
the condenser lens adjusts the position of the focal point of the charged particle beam to ensure that the focal point of the charged particle beam is located at the position of the deflector.

4. A charged particle beam apparatus comprising:
a charged particle source for emitting a charged particle beam;
an objective lens for focusing the charged particle beam on a sample;
a first condenser lens disposed between the charged particle source and the objective lens;
a second condenser lens disposed between the first condenser lens and the objective lens;
a detector for detecting an electron generated by irradiation of the charged particle beam on the sample;
a scanning deflector for scanning the sample with the charged particle beam focused by the objective lens;
a further deflector for deflecting an object point of the objective lens, which is disposed between the second condenser lens and the objective lens; and
a computer for controlling the objective lens and the deflector and for processing a signal from the detector to obtain an image of the sample;
wherein said computer determines an excitation current for the second condenser lens based on when a displacement of images, at least one of which is obtained in conditions when the further deflector is in operation and at least another of which is obtained when the further deflector is out of operation, is minimum for the position at which the object point coincides with the position of the further deflector when an optical condition of the charged particle beam apparatus is such that axial magnification is larger than 1, and
said computer feeds the excitation current back to the second condenser lens,
wherein said axial magnification is defined as follows:

$(b1/a1)^2 \cdot (b2/a2)^2 > 1$, where:

a1 is the distance between the object plane of the first condenser lens and the main plane of the first condenser lens,
b1 is the distance between the image plane of the first condenser lens and the main plane of the first condenser lens,
a2 is the distance between the object plane of the second condenser lens and the main plane of the second condenser lens, and
b2 is the distance between the image plane of the second condenser lens and the main plane of the second condenser lens.

5. A charged particle beam apparatus comprising:
a charged particle source for emitting a charged particle beam;
an objective lens for focusing the charged particle beam on a sample;
a first condenser lens disposed between the charged particle source and the objective lens;
a second condenser lens disposed between the first condenser lens and the objective lens;
a detector for detecting an electron generated by irradiation of the charged particle beam on the sample;
a scanning deflector for scanning the sample with the charged particle beam focused by the objective lens;
a plurality of deflectors for deflecting the charged particle beam, disposed in a vertical direction;
a computer for controlling the objective lens and the deflector and for processing a signal from the detector to obtain an image of the sample;
wherein said computer determines an excitation current for the second condenser lens based on when a displacement of images, at least one of which is obtained in conditions when the further deflector is in operation and at least another of which is obtained when the further deflector is out of operation, is minimum for the position at which the object point coincides with the position of the further deflector when an optical condition of the charged particle beam apparatus is such that axial magnification is larger than 1, and
said computer feeds the excitation current back to the second condenser lens,
wherein said axial magnification is defined as follows:

$(b1/a1)^2 \cdot (b2/a2)^2 > 1$, where:

a1 is the distance between the object plane of the first condenser lens and the main plane of the first condenser lens,
b1 is the distance between the image plane of the first condenser lens and the main plane of the first condenser lens,
a2 is the distance between the object plane of the second condenser lens and the main plane of the second condenser lens, and
b2 is the distance between the image plane of the second condenser lens and the main plane of the second condenser lens.

* * * * *